United States Patent
Filippi et al.

(10) Patent No.: US 9,054,108 B2
(45) Date of Patent: Jun. 9, 2015

(54) RANDOM LOCAL METAL CAP LAYER FORMATION FOR IMPROVED INTEGRATED CIRCUIT RELIABILITY

(71) Applicant: International Business Machines Corporation, Armonk, NY (US)

(72) Inventors: Ronald G. Filippi, Wappingers Falls, NY (US); Erdem Kaltalioglu, Newburgh, NY (US); Wai-Kin Li, Beacon, NY (US); Ping-Chuan Wang, Hopewell Junction, NY (US); Lijuan Zhang, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/465,255

(22) Filed: Aug. 21, 2014

(65) Prior Publication Data

US 2015/0028484 A1    Jan. 29, 2015

Related U.S. Application Data

(62) Division of application No. 13/953,058, filed on Jul. 29, 2013, now Pat. No. 8,906,799.

(51) Int. Cl.
| | |
|---|---|
| *H01L 23/48* | (2006.01) |
| *H01L 23/52* | (2006.01) |
| *H01L 29/40* | (2006.01) |
| *H01L 23/528* | (2006.01) |
| *H01L 23/532* | (2006.01) |

(52) U.S. Cl.
CPC ........ *H01L 23/528* (2013.01); *H01L 23/53257* (2013.01); *H01L 23/53242* (2013.01); *H01L 23/53209* (2013.01)

(58) Field of Classification Search
CPC .................. H01L 23/53238; H01L 23/53223; H01L 23/5329; H01L 23/53295; H01L 21/76877; H01L 2924/01027; H01L 2924/01044
USPC ........... 257/751, 760, 764, E23.145, E23.161
See application file for complete search history.

(56) References Cited

U.S. PATENT DOCUMENTS

| | | | |
|---|---|---|---|
| 7,026,714 B2 * | 4/2006 | Cunningham ................ 257/751 |
| 7,439,173 B2 | 10/2008 | Greco et al. |
| 8,039,379 B1 | 10/2011 | Alers et al. |
| 8,138,604 B2 | 3/2012 | Yang et al. |
| 8,193,090 B2 | 6/2012 | Lazovsky et al. |
| 8,404,145 B2 | 3/2013 | McGlashan-Powell et al. |
| 2008/0026541 A1 | 1/2008 | Edelstein et al. |
| 2009/0321938 A1 | 12/2009 | Cunningham |
| 2010/0084767 A1 | 4/2010 | Yang et al. |
| 2012/0104610 A1 | 5/2012 | Filippi et al. |

OTHER PUBLICATIONS

Anonymous (Disclosed Anonymously); Selectively Depositing Noble Metals on Thick Copper Layers; IP.com; Jul. 29, 2004.

* cited by examiner

*Primary Examiner* — Hoai V Pham
(74) *Attorney, Agent, or Firm* — Catherine Ivers; Howard M. Cohn (57) ABSTRACT

A method and structure for preventing integrated circuit failure due to electromigration and time dependent dielectric breakdown is disclosed. A randomly patterned metal cap layer is selectively formed on the metal interconnect lines (typically copper (Cu)) with an interspace distance between metal cap segments that is less than the critical length (for short-length effects). Since the diffusivity is lower for the Cu/metal cap interface than for the Cu/dielectric cap interface, the region with a metal cap serves as a diffusion barrier.

8 Claims, 8 Drawing Sheets

RANDOM LOCAL METAL CAP LAYER FORMATION FOR IMPROVED INTEGRATED CIRCUIT RELIABILITY

CROSS REFERENCE TO RELATED APPLICATIONS

This application is a division of commonly-owned, copending U.S. patent application Ser. No. 13/953,058 entitled RANDOM LOCAL METAL CAP LAYER FORMATION FOR IMPROVED INTEGRATED CIRCUIT RELIABILITY, and filed on Jul. 29, 2013.

FIELD OF THE INVENTION

The present invention relates generally to semiconductor fabrication, and more particularly, to a metal cap layer and method of formation.

BACKGROUND OF THE INVENTION

Integrated circuits (ICs) are typically fabricated with multiple levels of patterned metallization lines, electrically separated from one another by interlayer dielectrics containing vias at selected locations to provide electrical connections between levels of the patterned metallization lines. As these integrated circuits are scaled to smaller dimensions in a continual effort to provide increased density and performance (e.g., by increasing device speed and providing greater circuit functionality within a given area chip), the interconnect line width dimension becomes increasingly narrow, which in turn renders them more susceptible to deleterious effects such as electromigration.

Electromigration is a term referring to the phenomenon of mass transport of metallic atoms (e.g., copper or aluminum) which make up the interconnect material, as a result of unidirectional or DC electrical current conduction. More specifically, the electron current collides with the diffusing metal atoms, thereby pushing them in the direction of current travel. Over an extended period of time, the accumulation of metal at the anode end of the interconnect material significantly increases the local mechanical stress in the system. This in turn may lead to delamination, cracking, and even metal extrusion from the metal wire, thereby causing an electrical short to adjacent interconnects. Electromigration becomes increasingly more significant in integrated circuit design, as relative current densities through metallization lines continue to increase as the line width dimensions shrink.

In addition to electromigration, other factors such as time dependent dielectric breakdown (TDDB) are also factors in semiconductor reliability. As critical dimensions (CD) continue to shrink, the spacing between two metal lines reduces as well. Moreover, as the CD shrinks, it also provides challenges for liner deposition. Poor liner coverage will lead to the diffusion of the liner material, for example copper, to diffuse into the dielectric layer adjacent to it. The destruction of the dielectric layer can cause interconnects to short, rendering the IC defective. Unfortunately, steps taken to mitigate electromigration can adversely affect TDDB. It is therefore desirable to have a structure and method for improving yield and reducing defects caused by both electromigration and TDDB.

SUMMARY OF THE INVENTION

One embodiment of the present invention provides a method of fabricating a semiconductor structure, comprising: depositing a directed self-assembly (DSA) material onto a plurality of metal interconnect regions; treating the DSA material to put the DSA material into a self-assembled state; forming a plurality of metal cap regions on the semiconductor structure; removing the DSA material; and depositing a dielectric cap layer onto the semiconductor structure.

Another embodiment of the present invention provides a method of fabricating a semiconductor structure, comprising: forming a randomly oriented material on a substrate wherein the substrate has at least one interconnect region and wherein the randomly oriented material comprises a plurality of random lines having a spacing between adjacent random lines; forming a metal cap region in the spacing of the adjacent random lines and over the interconnect region; removing the randomly oriented material; and forming a dielectric cap layer above the metal cap region and the interconnect region.

Another embodiment of the present invention provides a semiconductor structure comprising: a semiconductor substrate; a plurality of metal interconnect regions formed on the semiconductor substrate; a plurality of randomly placed metal cap regions disposed on the plurality of metal interconnect regions; and a dielectric capping layer disposed on the plurality of metal interconnect regions and the plurality of randomly placed metal cap regions.

BRIEF DESCRIPTION OF THE DRAWINGS

The structure, operation, and advantages of the present invention will become further apparent upon consideration of the following description taken in conjunction with the accompanying figures (FIGS.). The figures are intended to be illustrative, not limiting. Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGS.) of the drawing, in which case typically the last two significant digits may be the same, the most significant digit being the number of the drawing figure (FIG.). Furthermore, for clarity, some reference numbers may be omitted in certain drawings.

DETAILED DESCRIPTION

Figure 1A:
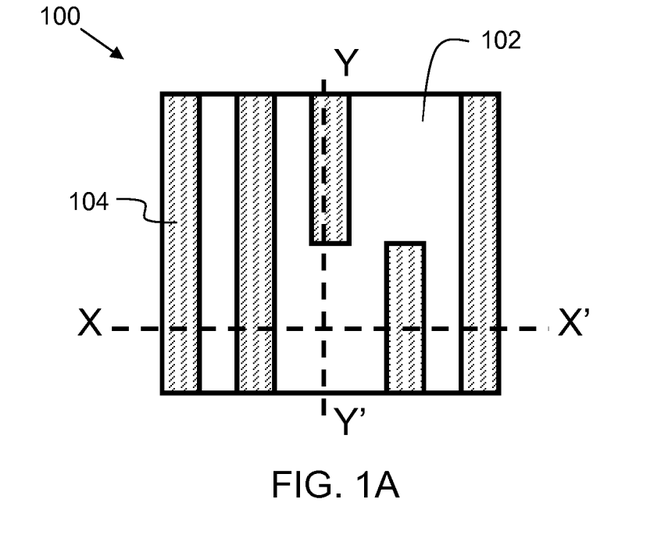
FIGS. 1A, 1B, and 1C show top and side views of a semiconductor structure at a starting point for embodiments of the present invention.
Figure 1B:
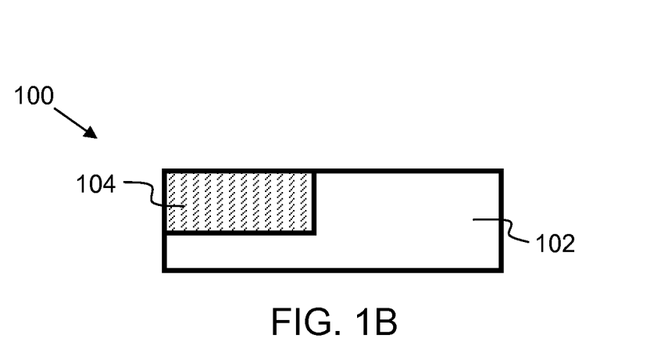
Figure 1C:
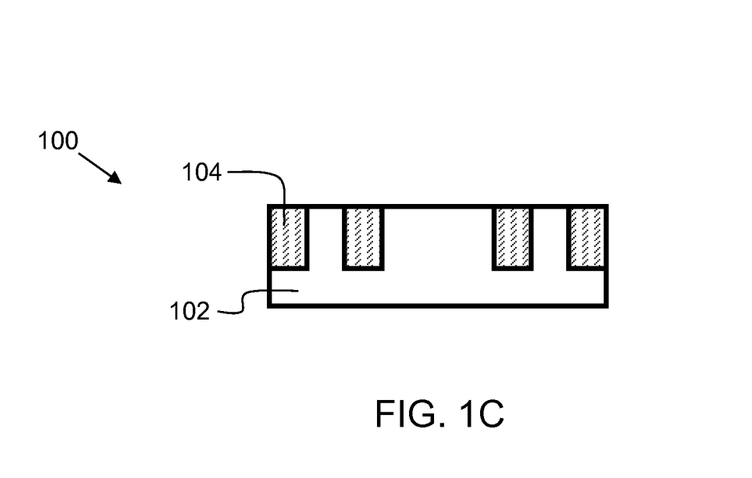

FIGS. 1A, 1B, and 1C show a semiconductor structure 100 at a starting point for embodiments of the present invention. FIG. 1A is a top-down view showing a semiconductor substrate 102 with a plurality of metal interconnect lines 104 formed thereon. The metal interconnect lines 104 may be comprised of copper, and may be formed by first etching a trench in semiconductor substrate 102, which may be an interlayer dielectric, and then filling the trench with the interconnect metal. FIG. 1B is a side view along line Y-Y' of FIG. 1A. FIG. 1C is a side view along line X-X' of FIG. 1A.

Figure 2A:
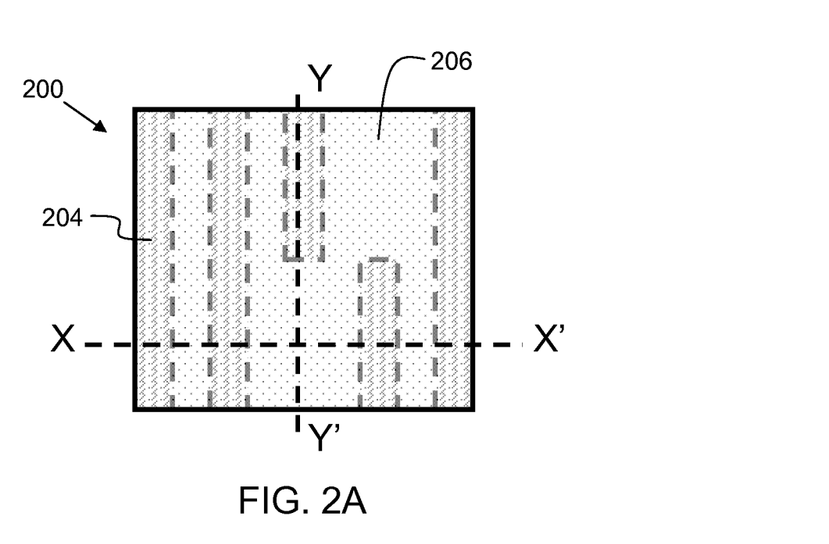
FIGS. 2A, 2B, and 2C show top and side views of a semiconductor structure after a subsequent process step of depositing a directed self-assembly (DSA) material for embodiments of the present invention.
Figure 2B:
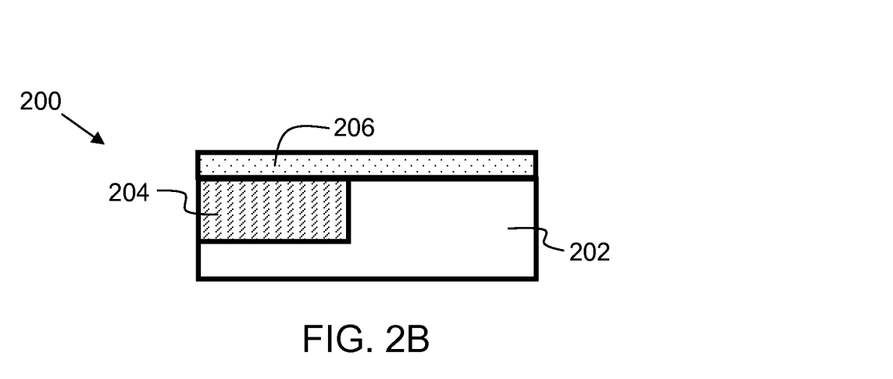
Figure 2C:
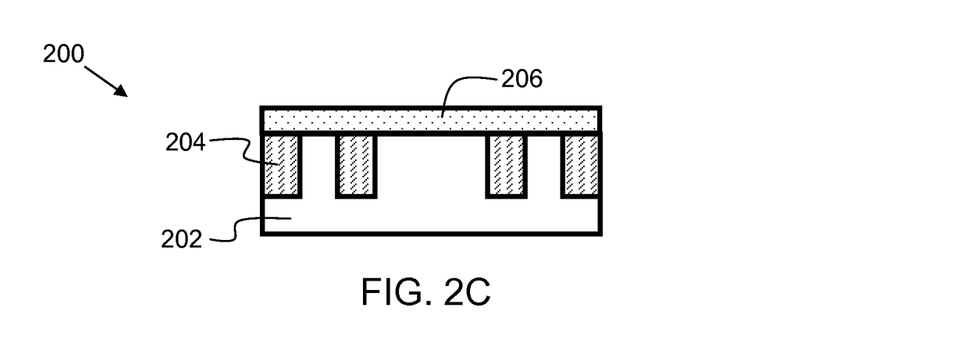

FIGS. 2A, 2B, and 2C show top and side views of a semiconductor structure 200 after a subsequent process step of forming a randomly oriented material on the substrate. This may comprise depositing a directed self-assembly (DSA) material. In embodiments, a spin-on coating process may be used to deposit the DSA material 206. As stated previously, similar elements may be referred to by similar numbers in various figures (FIGS.) of the drawing, in which case typically the last two significant digits may be the same. For example, semiconductor substrate 202 of FIG. 2B is similar to semiconductor substrate 102 of FIG. 1B. FIG. 2A is a top-down view showing a blanket deposition of a directed self-assembly (DSA) material 206. FIG. 2B is a side view along line Y-Y' of FIG. 2A. FIG. 2C is a side view along line X-X' of FIG. 2A. As can be seen in FIG. 2B and FIG. 2C, the DSA material 206 is deposited on both the metal interconnect lines 204 and semiconductor substrate 202.

The DSA material 206 may comprise a block copolymer material. Under the right conditions, the blocks of such copolymers phase separate into microdomains (also known as "microphase-separated domains" or "domains") to reduce the total free energy, and in the process, nanoscale features of dissimilar chemical compositions are formed. The ability of block copolymers to form such features enables their use in nanopatterning, and to the extent that features with smaller CDs can be formed, enables the construction of features which would otherwise be difficult and/or time consuming to print using conventional lithography. Directed self-assembly (DSA) is a method that combines aspects of self-assembly with a lithographically defined substrate to control the spatial arrangement of certain self-assembled block copolymer domains.

A di-block copolymer has blocks of two different polymers. A formula representative of a di-block copolymer is shown below:

$$(A)_m\text{-}(B)_n$$

in which the subscripts "m" and "n" represent the number of repeating units of A and B, respectively. The notation for a di-block copolymer may be abbreviated as A-b-B, where A represents the block copolymer of the first block, B represents the block copolymer of the second block, and -b- denotes that it is a di-block copolymer of blocks of A and B. For example, PS-b-PMMA represents a di-block copolymer of polystyrene (PS) and polymethylmethacrylate (PMMA).

In embodiments of the present invention, the DSA material 206 may comprise a di-block copolymer, where block A is polystyrene, and where block B is one of the following: polybutadiene, polyisoprene, polymethyl methacrylate, polyvinylpyridine, polyethylene oxide, polymethacrylic acid, polyacrylonitrile, polyethylene, polyisobutylene, polyacetaldehyde, polycaprolactone, or polydimethylsiloxane.

Although di-block copolymers are used in this disclosure, embodiments of the present invention are not necessarily limited to di-block copolymers and may include other block copolymers as well as other materials that will self assemble into inner and outer domains having dissimilar chemical structures and/or chemical properties. In some embodiments, the DSA material 206 may include more than two components. For example, the DSA material 206 may have a form such as AAAAAABBBBBBBBBBBBBBCCCCCCC, where "C" represents a third component. Alternatively, the DSA material 206 may have a form such as AAAABBBB-BAAAA.

Figure 3A:
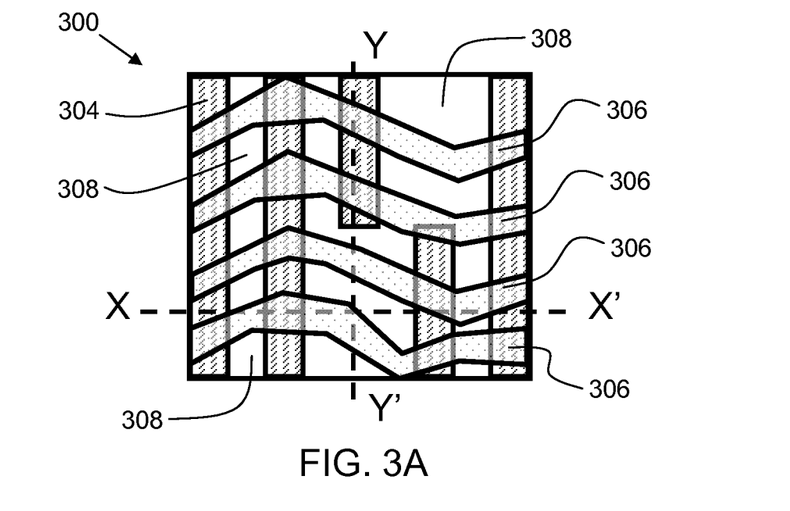
FIGS. 3A, 3B, and 3C show top and side views of a semiconductor structure after a subsequent process step of treating a directed self-assembly (DSA) material for embodiments of the present invention.
Figure 3B:
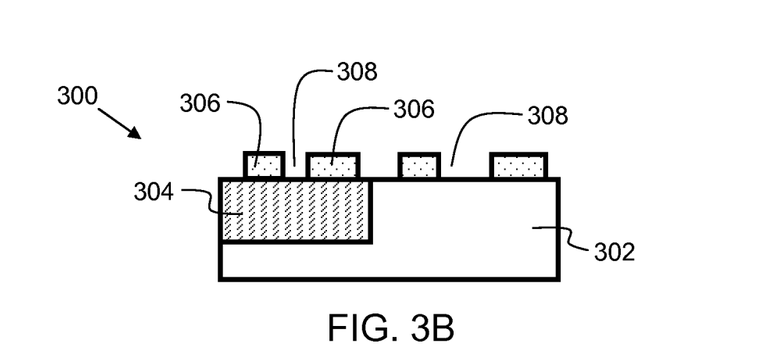
Figure 3C:
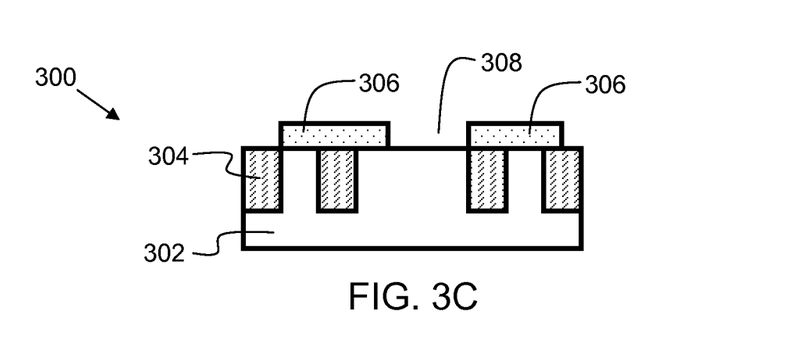

FIGS. 3A, 3B, and 3C show top and side views of a semiconductor structure 300 after a subsequent process step of treating a directed self-assembly (DSA) material. FIG. 3A is a top-down view showing the change in the directed self-assembly (DSA) material after treatment, which results in the DSA material transforming into a self-assembled state. FIG. 3B is a side view along line Y-Y' of FIG. 3A. FIG. 3C is a side view along line X-X' of FIG. 3A. Note that FIGS. 3A-3C are intended to illustrate the concept of the use of DSA material in this application, but should not be considered as limiting to the specific patterns illustrated. The treatment of the directed self-assembly (DSA) material may comprise an anneal. In some embodiments, the anneal temperature may range from about 100 degrees Celsius to about 450 degrees Celsius. In some embodiments, the anneal time duration may range from about 5 minutes to about one hour. As a result of the treatment of the DSA material, the DSA material arranges itself to form useful features, such as lines or other structures, without the use of additional masks. The treated DSA material changes from a blanket layer (see 206 of FIG. 2C) to a plurality of DSA material regions 306 with a plurality of space regions 308. The top surface of substrate 302 and metal interconnect lines 304 are exposed in the space regions 308.

Figure 4:
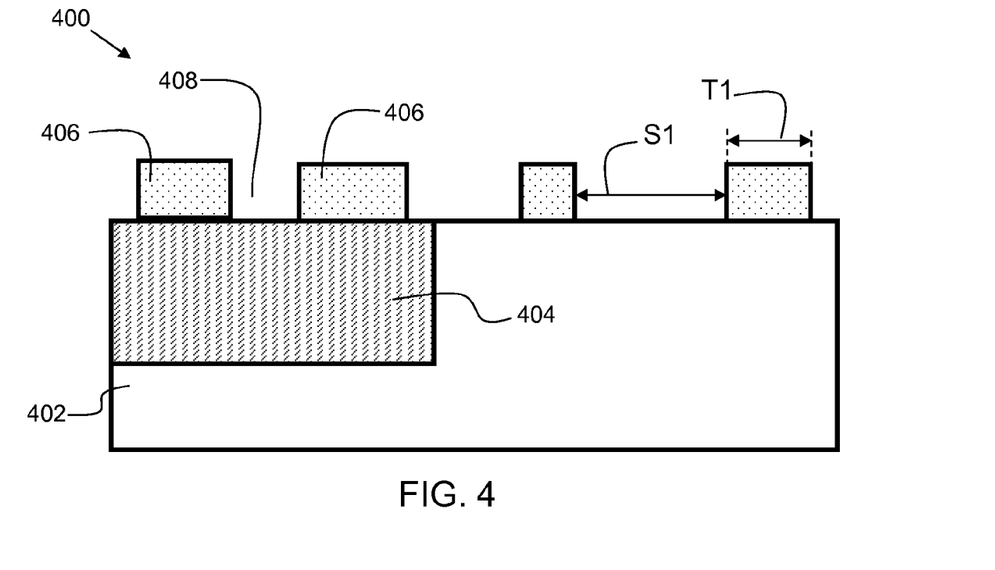
FIG. 4 shows details of an embodiment after treating a directed self-assembly (DSA) material for embodiments of the present invention.

FIG. 4 shows details of a semiconductor structure 400 after treating a directed self-assembly (DSA) material. Structure 400 comprises semiconductor substrate 402, and metal interconnect line 404 formed thereon. A plurality of DSA material regions 406 is disposed on the substrate 402 and metal interconnect line 404. Space regions 408 are disposed in between each DSA material region 406. Although the DSA material regions 406 are each of a similar structure, there is randomness in the size and position of each DSA material region. The interspacing distance S1 between each DSA material region may vary. In some embodiments, the interspacing distance S1 ranges from about 20 nanometers to about 80 nanometers. In some embodiments the interspacing distance S1 has a standard deviation (1 sigma) ranging from about 20 nanometers to about 40 nanometers. In some embodiments the interspacing distance S1 has a minimum distance of about 10 nanometers. In some embodiments the interspacing distance Si has a maximum distance of about 100 nanometers. Each DSA material region has a thickness T1. The thickness T1 may vary over the length of the DSA material region. In some embodiments, each DSA material region has an average thickness T1 ranging from about 30 nanometers to about 50 nanometers.

Figure 5A:
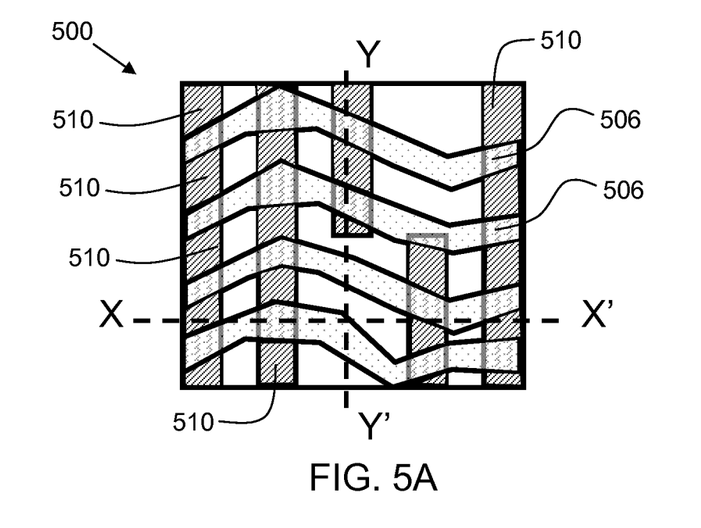
FIGS. 5A, 5B, and 5C show top and side views of a semiconductor structure after a subsequent process step of forming metal cap regions for embodiments of the present invention.
Figure 5B:
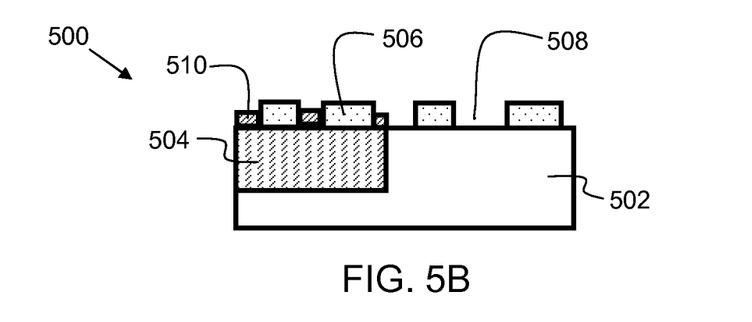
Figure 5C:
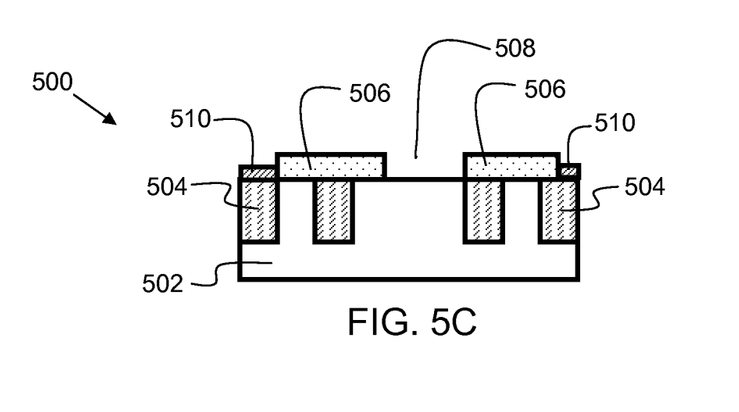

FIGS. 5A, 5B, and 5C show top and side views of a semiconductor structure after a subsequent process step of forming metal cap regions 510. FIG. 5A is a top-down view showing semiconductor structure 500 after selectively depositing metal cap regions. FIG. 5B is a side view along line Y-Y' of FIG. 5A. FIG. 5C is a side view along line X-X' of FIG. 5A.

The metal cap regions 510 are selectively deposited such that they only adhere to the metal interconnect regions 504, and not to the DSA material regions 506 or the semiconductor substrate 502. There is randomness in the size and position of each metal cap region 510. The positioning and shape of the metal cap regions is dependent on the position and shape of the DSA material, and forms a type of "negative" image of the DSA material, but selective only to adhere to the metal interconnect regions 504. In embodiments, the metal cap regions 510 may be comprised of ruthenium, tantalum, an alloy comprising cobalt, tungsten, and phosphorous (CoWP), or other suitable material.

Figure 6A:
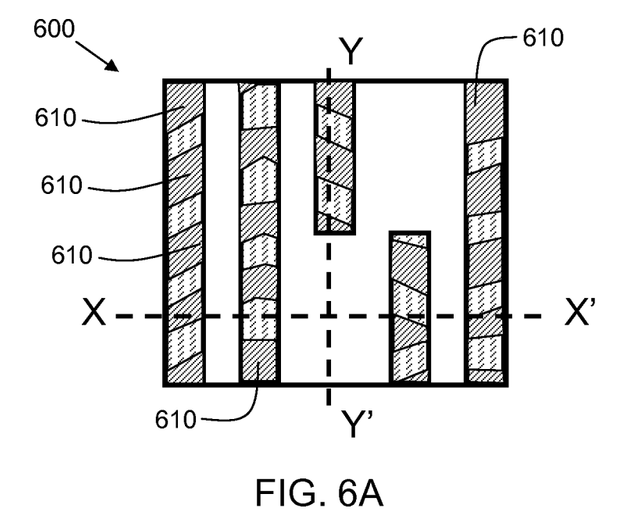
FIGS. 6A, 6B, 6C, and 6D show top and side views of a semiconductor structure after a subsequent process step of removing the DSA material for embodiments of the present invention.
Figure 6B:
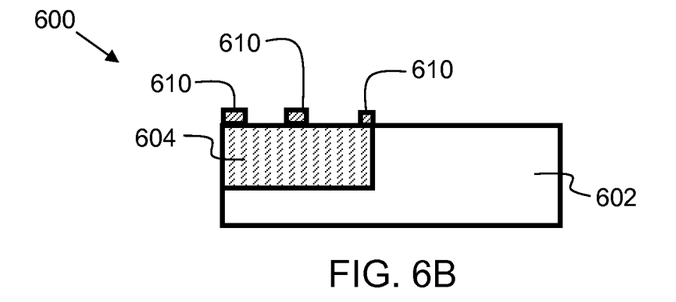
Figure 6C:
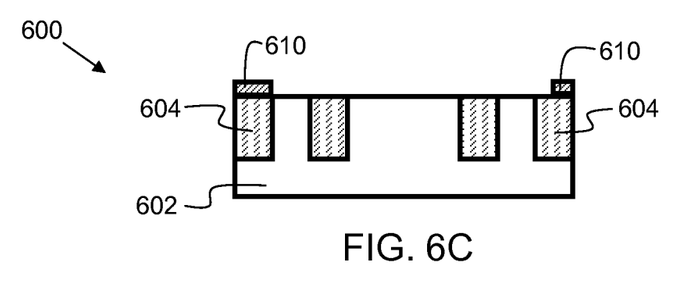

FIGS. 6A, 6B, and 6C show top and side views of a semiconductor structure 600 after a subsequent process step of removing the DSA material. FIG. 6A is a top-down view showing semiconductor structure 600 after removing the DSA material. FIG. 6B is a side view along line Y-Y' of FIG. 6A. FIG. 6C is a side view along line X-X' of FIG. 6A. In some embodiments, the DSA material may be removed with a solvent. In some embodiments, the solvent may comprise cyclohexanone, or NMP (N-methylpyrrolidone).

Figure 6D:
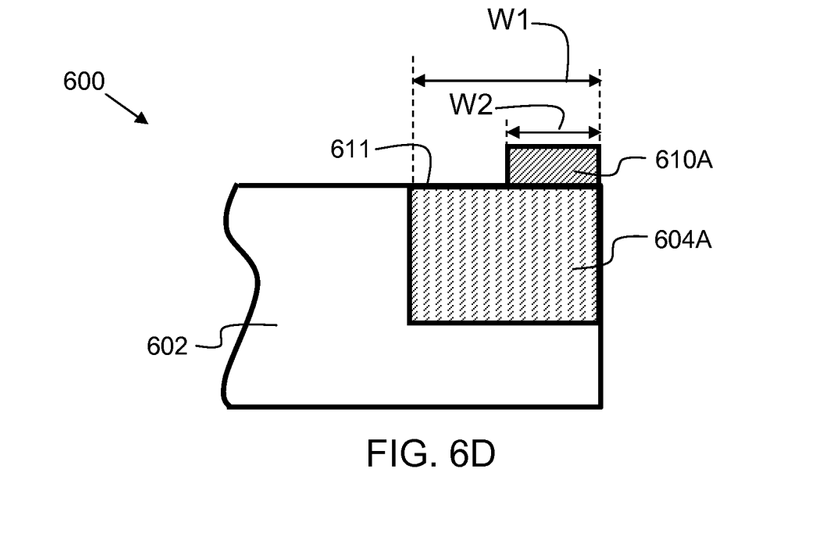

FIG. 6D shows additional details of FIG. 6C. Referring specifically to metal interconnect line 604A, which has a top surface 611, and interconnect width W1, there is a metal cap region 610A formed thereon. Metal cap region 610A is randomly oriented on the top surface 611 such that it partially crosses the top surface 611, but does not fully cross the top surface 611. In some embodiments, the metal cap region 610A has a cap region width W2 that is about 40 percent to about 70 percent of the interconnect width W1 of the metal interconnect line 604A. In embodiments of the present invention, metal cap region width W2 may be less than the interconnect width W1.

Figure 7:
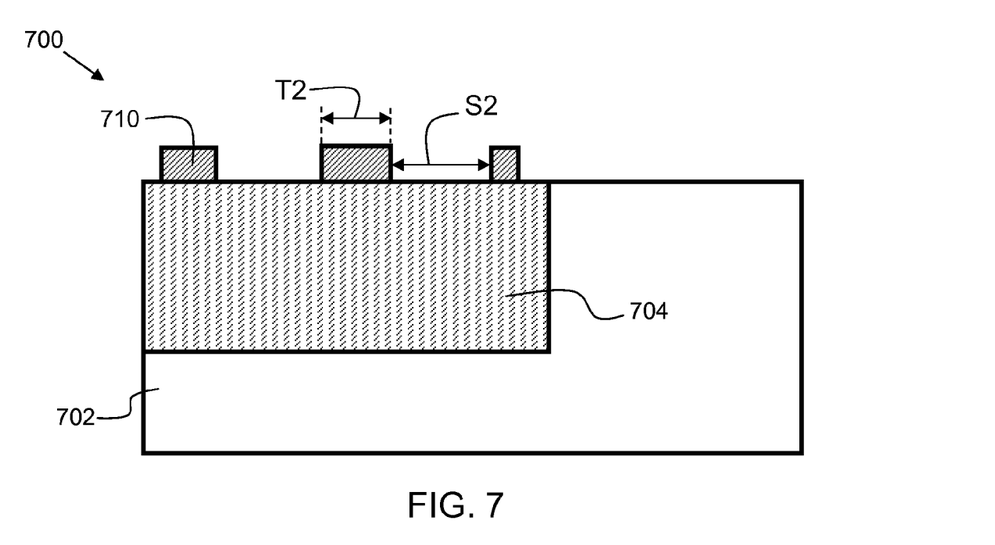
FIG. 7 shows details of an embodiment after removing the directed self-assembly (DSA) material for embodiments of the present invention.

FIG. 7 shows details of a semiconductor structure 700 after removing the directed self-assembly (DSA) material. Structure 700 comprises semiconductor substrate 702, and metal interconnect line 704 formed thereon. A plurality of metal cap regions 710 is disposed on the metal interconnect line 704. Each metal cap region 710 has a thickness T2. In some embodiments, each metal cap region 710 has an average thickness T2 ranging from about 30 nanometers to about 50 nanometers. Over the metal interconnect line 704, a metal cap interspacing distance S2 separates each metal cap region 710. In embodiments, the metal cap interspacing distance S2 may range from about 10 nanometers to about 100 nanometers. Hence, embodiments may have randomly placed metal cap regions with a minimum interspacing distance of 10 nanometers. Embodiments may have randomly placed metal cap regions with a maximum interspacing distance of 100 nanometers. In embodiments, the metal cap interspacing distance S2 may have a standard deviation (1 sigma) of interspacing ranging from about 30 nanometers to about 50 nanometers.

Figure 8A:
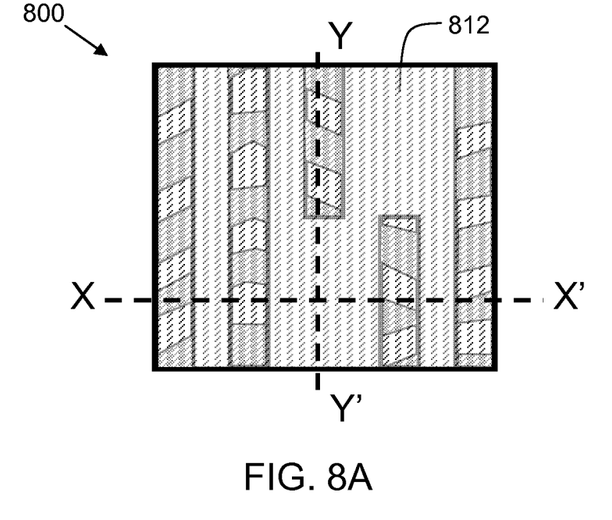
FIGS. 8A, 8B, and 8C show top and side views of a semiconductor structure after a subsequent process step of depositing a dielectric cap layer for embodiments of the present invention.
Figure 8B:
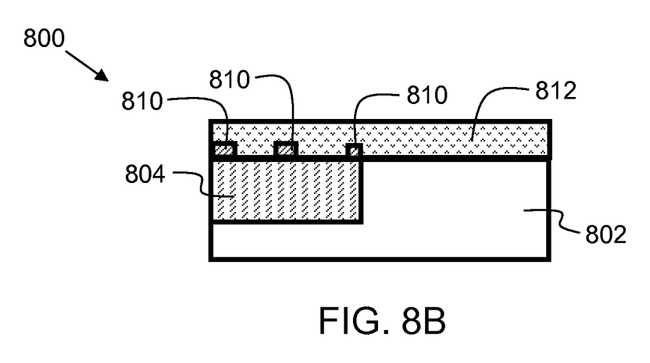
Figure 8C:
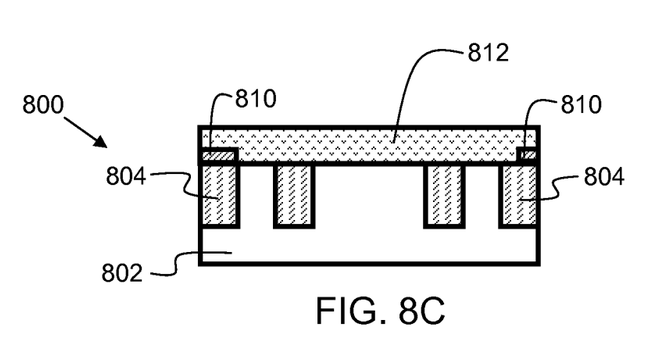

FIGS. 8A, 8B, and 8C show top and side views of a semiconductor structure after a subsequent process step of depositing a dielectric cap layer. FIG. 8A is a top-down view showing semiconductor structure 800 after depositing a dielectric cap layer 812. FIG. 8B is a side view along line Y-Y' of FIG. 8A. FIG. 8C is a side view along line X-X' of FIG. 8A. In some embodiments, the dielectric cap layer 812 is comprised of silicon nitride. In some embodiments, the dielectric cap layer 812 is comprised of a material including, but not limited to, fluorinated SiO2 (FSG), hydrogenated silicon oxycarbide (SiCOH), porous SiCOH, boro-phospho-silicate glass (BPSG), silicon oxide, silsesquioxanes, carbon (C) doped oxides (i.e., organosilicates) that include atoms of silicon (Si), carbon (C), oxygen (0), and/or hydrogen (H), thermosetting polyarylene ethers, SiLK (a polyarylene ether available from Dow Chemical Corporation), JSR (a spin-on silicon-carbon contained polymer material available from JSR Corporation), other low dielectric constant (<3.9) material, or layers thereof.

Figure 9:
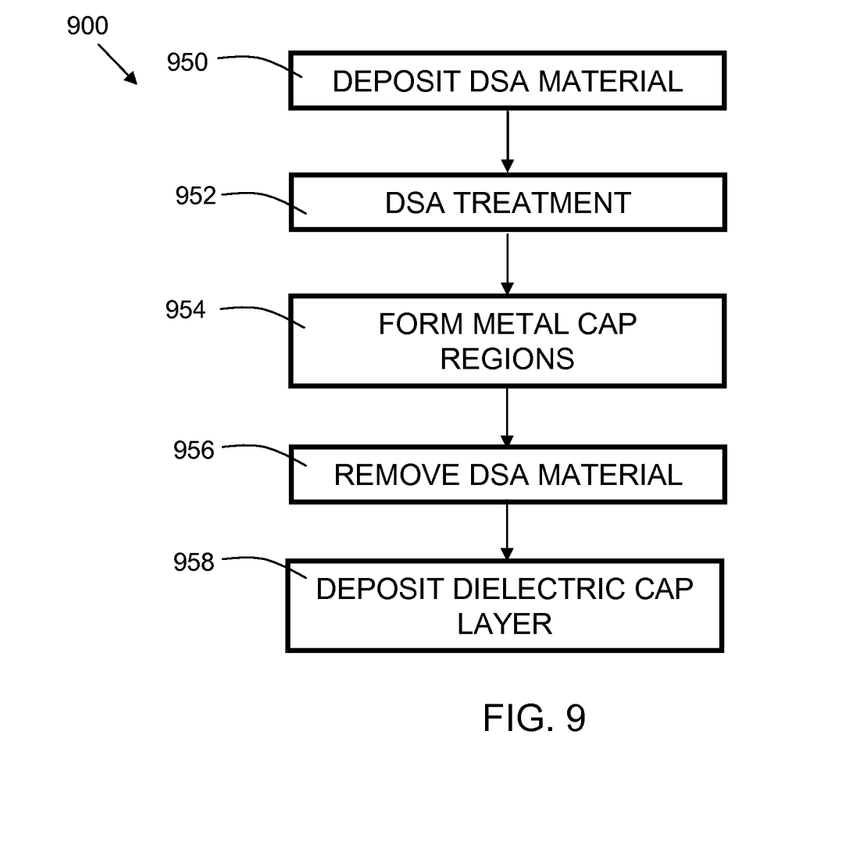
FIG. 9 is a flowchart indicating process steps for embodiments of the present invention.

FIG. 9 is a flowchart 900 indicating process steps for embodiments of the present invention. In process step 950, a directed self-assembly (DSA) material is deposited on a semiconductor structure (see 206 of FIG. 2B). In process step 952, a DSA treatment is performed to cause the DSA material to self-assemble. The treatment may include an anneal. In process step 954, metal cap regions are formed (see 510 of FIG. 5B). In process step 956, the DSA material is removed (see 600 of FIG. 6B). In process step 958, a dielectric cap layer is deposited (see 812 of FIG. 8B).

Electromigration and time dependent dielectric breakdown (TDDB) are two factors that can compromise the reliability of an integrated circuit (IC). A metal cap layer deposited on interconnect lines can reduce the effects of electromigration. However, depositing a metal cap layer can adversely impact TDDB. Although the metal cap deposition is intended to be selective, some metal particles may be deposited between the metal interconnect lines, leading to early TDDB failure.

Embodiments of the present invention mitigate the inherent tradeoff between electromigration and TDDB. A randomly patterned metal cap layer is selectively formed on the metal interconnect lines (typically copper (Cu)) with an interspace distance between metal cap segments that is less than the critical length (for short-length effects). Since the diffusivity is lower for the Cu/metal cap interface than for the Cu/dielectric cap interface, the region with a metal cap serves as a diffusion barrier. With random patterning, the metal cap density is considerably reduced, reducing the risk of TDDB failure, while still protecting against electromigration.

Embodiments of the present invention utilize Blech's equation, given as:

$$j \times Lb = C$$

where j is the current density;

Lb is the Blech length of a conductor; and

C is a constant depending on material properties and temperature.

Blech's equation indicates that under certain current densities, a critical length Lb exists. If the conductor is shorter than this critical length, no failure will occur as a result of the fact that a dynamic equilibrium will form between electromigration-induced ion flux and backward ion diffusion. Hence, the random pattern of the metal cap regions (e.g. as shown in FIG. 7) serves to prevent electromigration, so long as the interspacing distance S2 is less than the length Lb. In embodiments, Lb may range from about 5 microns to about 10 microns, and thus, is at least an order of magnitude larger than the interspacing distance S2. Therefore, the reduced metal cap density in embodiments of the present invention mitigates both electromigration and TDDB. Furthermore, the use of a DSA material to form the metal cap pattern eliminates extra lithography and mask steps, saving cost and complexity in the fabrication process.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A semiconductor structure comprising:
    a semiconductor substrate;
    a metal interconnect region formed on the semiconductor substrate;
    a plurality of randomly placed metal cap regions disposed on the metal interconnect region; and
    a dielectric capping layer disposed on the interconnect region and the plurality of randomly placed metal cap regions.

2. The semiconductor structure of claim 1, wherein the plurality of randomly placed metal cap regions have an interspacing ranging from about 10 nanometers to about 100 nanometers.

3. The semiconductor structure of claim 1, wherein the plurality of randomly placed metal cap regions have a standard deviation of interspacing ranging from about 30 nanometers to about 50 nanometers.

4. The semiconductor structure of claim 1, wherein the plurality of randomly placed metal cap regions are comprised of ruthenium.

5. The semiconductor structure of claim 1, wherein the plurality of randomly placed metal cap regions are comprised of tantalum.

6. The semiconductor structure of claim 1, wherein the plurality of randomly placed metal cap regions are comprised of cobalt.

7. The semiconductor structure of claim 1, wherein the metal interconnect region comprises a top surface and an interconnect width, and wherein at least one metal cap region from the plurality of randomly placed metal cap regions partially crosses the top surface.

8. The semiconductor structure of claim 7, wherein the metal cap region has a cap region width that is about 40 percent to about 70 percent of the interconnect width.

* * * * *